US008686523B2

(12) United States Patent
Meng et al.

(10) Patent No.: US 8,686,523 B2
(45) Date of Patent: Apr. 1, 2014

(54) MAGNETORESISTIVE DEVICE

(75) Inventors: Hao Meng, Singapore (SG); Rachid Sbiaa, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 94 days.

(21) Appl. No.: 13/487,423

(22) Filed: Jun. 4, 2012

(65) Prior Publication Data

US 2012/0306034 A1     Dec. 6, 2012

Related U.S. Application Data

(60) Provisional application No. 61/492,606, filed on Jun. 2, 2011.

(51) Int. Cl.
H01L 29/82         (2006.01)
(52) U.S. Cl.
USPC ............. 257/421; 257/E29.82; 257/E29.323; 365/171
(58) Field of Classification Search
USPC ............. 257/421, E29.82, E29.323; 365/171
See application file for complete search history.

(56) References Cited

U.S. PATENT DOCUMENTS

| 8,174,873 B2* | 5/2012 | Suzuki et al. | 365/158 |
| 2004/0130929 A1* | 7/2004 | Tsang | 365/145 |
| 2012/0087185 A1* | 4/2012 | Zhou et al. | 365/171 |
| 2012/0292723 A1* | 11/2012 | Luo et al. | 257/421 |

* cited by examiner

Primary Examiner — Thanh V Pham
(74) Attorney, Agent, or Firm — K. David Crockett, Esq.; Niky Economy Syrengelas, Esq.; Crockett & Crockett, PC

(57) ABSTRACT

A magnetoresistive device having a magnetic junction including a first fixed magnetic layer structure, a second fixed magnetic layer structure, and a free magnetic layer structure, wherein the first second and free magnetic layer structures are arranged one over the other. The first second and free magnetic layer structures have respective magnetization orientations configured to orient in a direction at least substantially perpendicular to a plane defined by an interface between the free magnetic layer structure and either one of the first fixed magnetic layer structure or the second fixed magnetic layer structure. The respective magnetization orientations of the first and the second fixed magnetic layer structures are oriented anti-parallel to each other, and the first fixed magnetic layer structure is a static fixed magnetic layer structure having a switching field that is larger than a switching field of the free magnetic layer structure.

20 Claims, 7 Drawing Sheets

MAGNETORESISTIVE DEVICE

This application claims the benefit of priority of U.S. provisional application No. 61/492,606, filed 2 Jun. 2011, the content of it being hereby incorporated by reference in its entirety for all purposes.

FIELD OF THE INVENTIONS

Various embodiments relate to a magnetoresistive device.

BACKGROUND OF THE INVENTIONS

Spin transfer torque magnetic random access memory (STT-MRAM) with perpendicular anisotropy (p-STT-MRAM) has better scalability than in-plane STT-MRAM. However, the coupling field between a free layer and a reference layer in p-STT-MRAM is so strong (up to several hundred Oersteds, Oe) that the magnetization of the free layer is biased to a direction, which prefers being in parallel to that of the reference layer. Thus, the switching threshold (for current or field) is high for parallel (P) to antiparallel (AP) switching (P→AP) and low for antiparallel (AP) to parallel (P) switching (AP→P). If the coupling field is too strong, the minor hysteresis loop of the free layer completely falls in the positive (or negative) field region and loses its storage function at zero field.

On top of that, the spin current amplitude involved in PP switching is intrinsically asymmetrical due to the population difference of majority spin and minority spin. Such asymmetrical writing current brings difficulty for MRAM integrated circuit design and integration with transistor.

SUMMARY

According to an embodiment, a magnetoresistive device having a magnetic junction is provided. The magnetic junction may include a first fixed magnetic layer structure having a fixed magnetization orientation, a second fixed magnetic layer structure having a fixed magnetization orientation, and a free magnetic layer structure having a variable magnetization orientation, wherein the first fixed magnetic layer structure, the second fixed magnetic layer structure and the free magnetic layer structure are arranged one over the other, wherein the first fixed magnetic layer structure, the second fixed magnetic layer structure and the free magnetic layer structure have respective magnetization orientations configured to orient in a direction at least substantially perpendicular to a plane defined by an interface between the free magnetic layer structure and either one of the first fixed magnetic layer structure or the second fixed magnetic layer structure, wherein the respective magnetization orientations of the first fixed magnetic layer structure and the second fixed magnetic layer structure are oriented anti-parallel to each other, and wherein the first fixed magnetic layer structure is a static fixed magnetic layer structure having a switching field that is larger than a switching field of the free magnetic layer structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a schematic block diagram of a magnetoresistive device having a magnetic junction, while

DETAILED DESCRIPTION OF THE INVENTIONS

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the devices may be analogously valid for the other device.

In the context of various embodiments, the phrase "at least substantially" may include "exactly" and a variance of +/−5% thereof. As an example and not limitations, "A is at least substantially same as B" may encompass embodiments where A is exactly the same as B, or where A may be within a variance of +/−5%, for example of a value, of B, or vice versa.

In the context of various embodiments, the term "about" as applied to a numeric value encompasses the exact value and a variance of +/−5% of the value.

As used herein, the term "and/or" includes any and all combinations of one or more of the associated listed items.

Various embodiments relate to a magnetic random access memory (MRAM), for example relating to asymmetrical writing current for spin transfer torque MRAM (STT-MRAM).

Various embodiments may provide tunable bias field on the free layer in a spin transfer torque MRAM with perpendicular anisotropy (p-STT-MRAM).

Various embodiments may provide a magnetic junction or a magnetic tunnel junction (MTJ) stack structure, for example for a spin transfer torque magnetic random access memory (STT-MRAM) with perpendicular anisotropy (p-STT-MRAM), for offsetting the bias field on at least a free layer (or a soft magnetic layer) and balancing the intrinsic asymmetric writing current for the memory device (e.g. a magnetoresistive device).

Figure 1A:
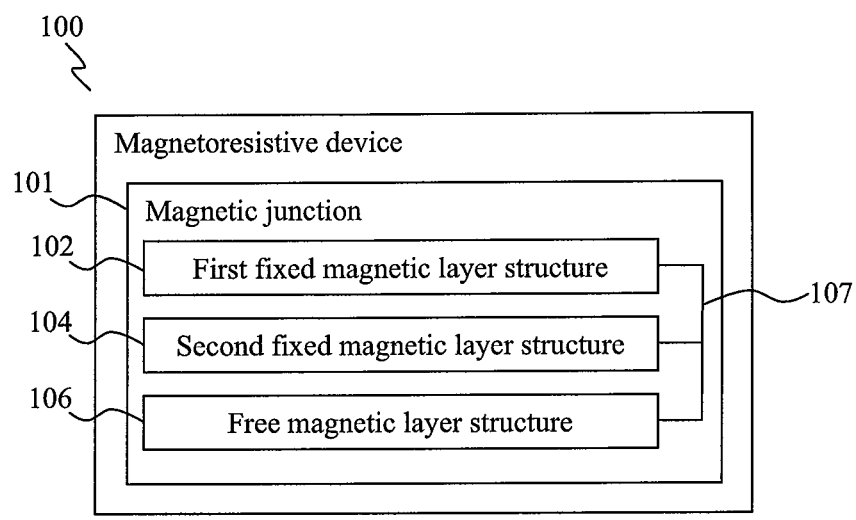
Figure 1B:
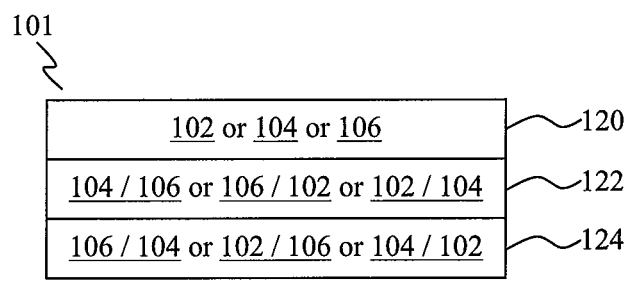
FIG. 1B shows a simplified cross-sectional representation of the magnetic junction of the magnetoresistive device of the embodiment of FIG. 1A, according to various embodiments.

FIG. 1A shows a schematic block diagram of a magnetoresistive device 100 having a magnetic junction 101, while FIG. 1B shows a simplified cross-sectional representation of the magnetic junction 101 of the magnetoresistive device 100 of the embodiment of FIG. 1A, according to various embodiments. The magnetic junction 101 may have a stack structure. The magnetic junction 101 may be a magnetic tunnel junction (MTJ), for example for a tunnel magnetoresistive (TMR) device. The magnetic junction 101 may also be incorporated in a giant magnetoresistive (GMR) device, for example a copper (Cu) spacer layer based GMR device or a full heusler alloy based GMR device or an organic GMR device.

The magnetic junction 101 includes a first fixed magnetic layer structure 102 having a fixed magnetization orientation, a second fixed magnetic layer structure 104 having a fixed magnetization orientation, and a free magnetic layer structure 106 having a variable magnetization orientation, wherein the first fixed magnetic layer structure 102, the second fixed magnetic layer structure 104 and the free magnetic layer structure 106 are arranged one over the other, wherein the first fixed magnetic layer structure 102, the second fixed magnetic layer structure 104 and the free magnetic layer structure 106 have respective magnetization orientations configured to orient in a direction at least substantially perpendicular to a plane defined by an interface between the free magnetic layer structure 106 and either one of the first fixed magnetic layer structure 102 or the second fixed magnetic layer structure 104, wherein the respective magnetization orientations of the first fixed magnetic layer structure 102 and the second fixed magnetic layer structure 104 are oriented anti-parallel or opposite to each other, and wherein the first fixed magnetic layer structure 102 is a static fixed magnetic layer structure having a switching field that is larger than a switching field of the free magnetic layer structure 106. In FIG. 1A, the line represented as 107 is illustrated to show the relationship between the different components, which may include electrical coupling and/or mechanical coupling.

In the context of various embodiments, the term "static fixed magnetic layer structure" may mean a magnetic layer structure having a fixed magnetization orientation that is static, where the magnetic moments within the static fixed magnetic layer structure may not oscillate or undergo precession, for example the magnetic moments may not purposely oscillate or undergo precession under a magnetic field or current.

In the context of various embodiments, a static fixed magnetic layer may be or may include a single magnetic layer or a multilayer structure, which may include more than one magnetic/non-magnetic layers.

In the context of various embodiments, the term "switching field" may mean a field (e.g. a magnetic field, e.g. due to a current applied to the magnetoresistive device 100) necessary for switching the magnetization orientation of a magnetic layer, e.g. a ferromagnetic hard layer or a ferromagnetic soft layer.

In various embodiments, the magnetic junction 101 further comprises a first spacer layer arranged between the first fixed magnetic layer structure 102 and the free magnetic layer structure 106, the first spacer layer having a spin diffusion length configured to reduce interaction of a spin current from the first fixed magnetic layer structure 102 on the magnetization orientation of the free magnetic layer structure 106.

In the context of various embodiments, the term "spin diffusion length" may mean a length or distance scale over which electrons are de-polarized. In other words, the spin diffusion length may relate to the distance spins may travel or survive in a material. Spin diffusion length varies depending on the material. As non-limiting examples, the spin diffusion length for copper (Cu) may be more than 1 μm, while the spin diffusion length for tantalum (Ta) may be less than 5 nm.

As shown in FIG. 1B, the first fixed magnetic layer structure 102, the second fixed magnetic layer structure 104 and the free magnetic layer structure 106 may be arranged one over the other. For example, the first fixed magnetic layer structure 102 may be arranged as the top layer 120 of the magnetic junction 101, with the intermediate layer 122 being the second fixed magnetic layer structure 104 and the bottom layer 124 being the free magnetic layer structure 106, or the intermediate layer 122 being the free magnetic layer structure 106 and the bottom layer 124 being the second fixed magnetic layer structure 104.

In embodiments where the second fixed magnetic layer structure 104 is arranged as the top layer 120 of the magnetic junction 101, the intermediate layer 122 may be the free magnetic layer structure 106 with the bottom layer 124 being the first fixed magnetic layer structure 102, or the intermediate layer 122 may be the first fixed magnetic layer structure 102 with the bottom layer 124 being the free magnetic layer structure 106.

In embodiments where the free magnetic layer structure 106 is arranged as the top layer 120 of the magnetic junction 101, the intermediate layer 122 may be the first fixed magnetic layer structure 102 with the bottom layer 124 being the second fixed magnetic layer structure 104, or the intermediate layer 122 may be the second fixed magnetic layer structure 104 with the bottom layer 124 being the first fixed magnetic layer structure 102.

In the context of various embodiments, the first spacer layer arranged between the first fixed magnetic layer structure 102 and the free magnetic layer structure 106 may be arranged between the top layer 120 and the intermediate layer 122 or between the intermediate layer 122 and the bottom layer 124.

In the context of various embodiments, the first spacer layer may include or may be of a conductive and non-magnetic material, for example including but not limited to tantalum (Ta), chromium (Cr), palladium (Pd), platinum (Pt) and ruthenium (Ru). These materials have a short spin diffusion length in order to minimise or eliminate the effect of the spin current from the first fixed magnetic layer structure 102 on the free magnetic layer structure 106. In various embodiments, the first spacer layer may be configured as a seed layer for the first fixed magnetic layer structure 102, e.g. for the growth or formation of the first fixed magnetic layer structure 102. In the context of various embodiments, the first spacer layer may have a thickness greater than 2 nm, for example a thickness in a range of between about 2 nm and about 10 nm, e.g. between about 2 nm and about 8 nm, between about 2 nm and about 5 nm or between about 5 nm and about 10 nm.

In various embodiments, the first fixed magnetic layer structure 102 may be configured to generate a bias field on the free magnetic layer structure 106 that is larger than or at least substantially similar to a bias field generated by the second fixed magnetic layer structure 104. Therefore, the bias field generated by the first fixed magnetic layer structure 102 on the free magnetic layer structure 106 may exceed the bias field generated by the second fixed magnetic layer structure 104 on the free magnetic layer structure 106, producing a net bias field acting on the free magnetic layer structure 106 by the first fixed magnetic layer structure 102. It should be appreciated that the net bias field acting on the free magnetic layer structure 106 may vary in a range, as long as the circuit design and coding are able to accommodate the net bias field. In the context of various embodiments, the term "bias field" may mean the sum of the static magnetic field and the exchange coupled field from the fixed magnetic layer structure (for example either the first fixed magnetic layer structure 102 or the second fixed magnetic layer structure 104) on the free magnetic layer structure 106. The amplitude of the bias field depends on the thickness of the spacer layer (e.g. the first spacer layer and/or the second spacer layer as described below) and the magnetization of the materials of the respective fixed magnetic layer structures, which is adjacent to the respective spacer layers.

In the context of various embodiments, in order to increase the bias field on the free magnetic layer structure 106, a magnetic layer (e.g. a magnetic layer with a high magnetization) may be arranged between the first fixed magnetic layer structure 102 and the first spacer layer. The magnetic layer may be exchange coupled with the first fixed magnetic layer structure 102. The magnetic layer may include but not limited to cobalt-iron (CoFe) or cobalt-iron-boron (CoFeB). In the context of various embodiments, the term "exchange coupled" may mean ferromagnetic exchange coupling between two ferromagnetic layers. The magnetization of the two ferromagnetic layers may be aligned along the same direction and may rotate synchronously under an applied magnetic field.

In various embodiments, the free magnetic layer structure 106 may be arranged between the first fixed magnetic layer structure 102 and the second fixed magnetic layer structure 104.

In various embodiments, the magnetoresistive device 100 or the magnetic junction 101 may further include a second spacer layer arranged between the second fixed magnetic layer structure 104 and the free magnetic layer structure 106. In the context of various embodiments, the second spacer layer may include or may be of a non-magnetic material, for example a non-conductive and non-magnetic material including but not limited to magnesium oxide (MgO), alumina (AlO$_x$), and titanium oxide (TiO$_x$), or a conductive and non-magnetic material such as copper (Cu).

In embodiments where the second spacer layer is a non-conductive and non-magnetic material, e.g. magnesium oxide (MgO), alumina (AlO$_x$), or titanium oxide (TiO$_x$), the magnetic junction 101 may be a magnetic tunnel junction (MTJ) as part of a tunnel magnetoresistive (TMR) device. In embodiments where the second spacer layer is a conductive and non-magnetic material, e.g. copper (Cu), the magnetic junction 101 may be part of a giant magnetoresistive (GMR) device.

Referring to FIG. 1B, in embodiments where the first spacer layer is arranged between the top layer 120 and the intermediate layer 122, the second spacer layer is arranged between the intermediate layer 122 and the bottom layer 124. In addition, in embodiments where the first spacer layer is arranged between the intermediate layer 122 and the bottom layer 124, the second spacer layer is arranged between the top layer 120 and the intermediate layer 122. In the context of various embodiments, the first spacer layer arranged between the first fixed magnetic layer structure 102 and the free magnetic layer structure 106 has a shorter spin diffusion length while the second spacer layer arranged between the second fixed magnetic layer structure 104 and the free magnetic layer structure 106 has a long spin diffusion length sufficient to output magnetoresistive signals and enable spin transfer torque effect.

In various embodiments, the magnetoresistive device 100 or the magnetic junction 101 may further include a first spin enhancing layer arranged adjacent to or in contact with a first side of the second spacer layer, and a second spin enhancing layer arranged adjacent to or in contact with a second side of the second spacer layer, the first side and the second side being opposite to each other. In the context of various embodiments, each of the first spin enhancing layer and the second spin enhancing layer may have a thickness of between about 0.1 nm and about 3.5 nm, e.g. between about 0.1 nm and about 3 nm, between about 0.1 nm and about 2 nm, between about 0.1 nm and about 1 nm, between about 1 nm and about 3 nm, between about 0.1 nm and about 1 nm, or between about 0.1 nm and about 0.4 nm. The first spin enhancing layer and the second spin enhancing layer may have the same thickness or different thicknesses. In the context of various embodiments, each of the first spin enhancing layer and the second spin enhancing layer may include a single layer of cobalt-iron-boron (CoFeB) or cobalt-iron (CoFe) or iron (Fe), or a bilayer structure including a first layer including cobalt-iron-boron (CoFeB), and a second layer including cobalt-iron (CoFe), i.e. (CoFeB/CoFe). In the context of various embodiments, the term "spin enhancing layer" may mean a layer that may promote the spin polarization so that magnetoresistive may be increased and spin transfer torque current density may be reduced.

In various embodiments, the magnetoresistive device 100 or the magnetic junction 101 may further include a third fixed magnetic layer structure having a fixed magnetization orientation, and a second free magnetic layer structure having a variable magnetization orientation, wherein the first fixed magnetic layer structure 102, the second fixed magnetic layer structure 104, the third fixed magnetic layer structure, the free magnetic layer structure 106 and the second free magnetic layer structure are arranged one over the other, wherein the third fixed magnetic layer structure and the second free magnetic layer structure have respective magnetization orientations configured to orient in a direction at least substantially perpendicular to the plane defined by the interface between the free magnetic layer structure 106 and either one of the first fixed magnetic layer structure 102 or the second fixed magnetic layer structure 104, and wherein the magnetization orientation of the third fixed magnetic layer structure is oriented anti-parallel to the magnetization orientation of either the first fixed magnetic layer structure 102 or the second fixed magnetic layer structure 104. The third fixed magnetic layer structure may be or may include a static fixed magnetic layer structure. The third fixed magnetic layer structure may be or may include a single magnetic layer or a multilayer structure. As a non-limiting example, the free magnetic layer structure 106 may be arranged between the first fixed magnetic layer structure 102 and the second fixed magnetic layer structure 104, between the first fixed magnetic layer structure 102 and the third fixed magnetic layer structure, or between the second fixed magnetic layer structure 104 and the third fixed magnetic layer structure. This may similarly be applicable to the second free magnetic layer structure, e.g. the second free magnetic layer structure may be arranged between the third fixed magnetic layer structure and either one of the first fixed magnetic layer structure 102 or the second fixed magnetic layer structure 104.

In various embodiments, the third fixed magnetic layer structure may be a static fixed magnetic layer structure having a switching field that is larger than a switching field of the second free magnetic layer structure.

In various embodiments, the magnetoresistive device 100 or the magnetic junction 101 may further include a third spacer layer arranged between the third fixed magnetic layer structure and the second free magnetic layer structure, the third spacer layer having a spin diffusion length configured to reduce, e.g. minimise interaction of a spin current from the third fixed magnetic layer structure on the magnetization orientation of the second free magnetic layer structure.

In the context of various embodiments, the third spacer layer may include or may be of a conductive and non-magnetic material, for example including but not limited to tantalum (Ta), chromium (Cr), palladium (Pd), platinum (Pt) and ruthenium (Ru). In the context of various embodiments, the third spacer layer may have a thickness greater than 2 nm, for example a thickness in a range of between about 2 nm and about 10 nm, e.g. between about 2 nm and about 8 nm, between about 2 nm and about 5 nm or between about 5 nm and about 10 nm.

In the context of various embodiments, in order to increase the bias field on the second free magnetic layer structure, a magnetic layer (e.g. a magnetic layer with a high magnetization) may be arranged between the third fixed magnetic layer structure and the third spacer layer. The magnetic layer may be exchange coupled with the third fixed magnetic layer structure. The magnetic layer may include but not limited to cobalt-iron (CoFe) or cobalt-iron-boron (CoFeB).

In the context of various embodiments, the term "fixed magnetic layer structure" may mean a magnetic layer structure having a fixed magnetization orientation. The fixed magnetic layer structure may include a hard ferromagnetic material. The hard ferromagnetic material may be resistant to magnetization and demagnetization (i.e. not easily magnetized and demagnetized), and may have a high hysteresis loss and a high coercivity. In the context of various embodiments, a fixed magnetic layer structure may be referred to as a hard layer or a ferromagnetically hard layer.

In the context of various embodiments, the term "free magnetic layer structure" may mean a magnetic layer structure having a varying or variable magnetization orientation. In other words, the magnetization orientation may be changed or varied, for example by applying a current, such as a spin-polarized current. The free magnetic layer structure may include a soft ferromagnetic material. The soft ferromagnetic material may be receptive to magnetization and demagnetization (i.e. easily magnetized and demagnetized), and may have a small hysteresis loss and a low coercivity. In the context of various embodiments, a free magnetic layer structure may be referred to as a soft layer or a ferromagnetically soft layer.

In the context of various embodiments, the first fixed magnetic layer structure 102 may include a single layer including iron-platinum (FePt) or cobalt-platinum (CoPt), or a bilayer structure including a first layer including cobalt (Co) or iron (Fe) or cobalt-iron (CoFe) (e.g. alloy of cobalt and iron), and a second layer including platinum (Pt) or palladium (Pd) or nickel (Ni). For example, the first fixed magnetic layer structure 102 may include a bilayer or a multilayer of (Co/Pt), (Co/Pd), (Fe/Pt), (Fe/Pd), (CoFe/Pt), (CoFe/Pd) or (Co/Ni). The $(Co/Pt)_x$ multilayer, the $(Co/Pd)_x$ multilayer, the $(Fe/Pt)_x$ multilayer, the $(Fe/Pd)_x$ multilayer, the $(CoFe/Pt)_x$ multilayer, the $(CoFe/Pd)_x$ multilayer or the $(Co/Ni)_x$ multilayer (where x may be any integer) may include a plurality of a bilayer structure having a first layer of Co, Fe and CoFe respectively, and a second layer of Pt, Pd and Ni respectively. As non-limiting examples, the first fixed magnetic layer structure 102 may include $(Co/Pd)_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd) or $(Co/Pd)_{15}$, of 15 layers of Co arranged alternately with 15 layers of Pd, i.e. 15 bilayer structures of (Co/Pd).

In the context of various embodiments, the second fixed magnetic layer structure 104 may include a single layer including iron-platinum (FePt) or cobalt-platinum (CoPt), or a bilayer structure including a first layer including cobalt (Co) or iron (Fe) or cobalt-iron (CoFe), and a second layer including platinum (Pt) or palladium (Pd) or nickel (Ni). For example, the second fixed magnetic layer structure 104 may include a bilayer or a multilayer of (Co/Pt), (Co/Pd), (Fe/Pt), (Fe/Pd), (CoFe/Pt), (CoFe/Pd) or (Co/Ni). The $(Co/Pt)_x$ multilayer, the $(Co/Pd)_x$ multilayer, the $(Fe/Pt)_x$ multilayer, the $(Fe/Pd)_x$ multilayer, the $(CoFe/Pt)_x$ multilayer, the $(CoFe/Pd)_x$ multilayer or the $(Co/Ni)_x$ multilayer (where x may be any integer) may include a plurality of a bilayer structure having a first layer of Co, Fe and CoFe respectively, and a second layer of Pt, Pd and Ni respectively. As non-limiting examples, the second fixed magnetic layer structure 104 may include $(Co/Pd)_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd) or $(Co/Pd)_{15}$, of 15 layers of Co arranged alternately with 15 layers of Pd, i.e. 15 bilayer structures of (Co/Pd).

In the context of various embodiments, the free magnetic layer structure 106 may include a single layer or a plurality of layers. The free magnetic layer structure 106 may include but not limited to CoFeB, CoFeB/FePt, CoFeB/CoPt, CoFeB/$(Co/Pd)_x$ or CoFeB/$(Co/Pt)_x$, where x may be any integer, for example between 1 and 15. As a non-limiting example based on CoFeB/$(Co/Pd)_5$, the free magnetic layer structure 106 may include a layer of CoFeB and a multilayer of $(Co/Pd)_5$, of 5 layers of Co arranged alternately with 5 layers of Pd, i.e. 5 bilayer structures of (Co/Pd), i.e. (Co/Pd/Co/Pd/Co/Pd/Co/Pd), with the layer of CoFeB and the multilayer of $(Co/Pd)_5$ arranged over each other.

In the context of various embodiments, the third fixed magnetic layer structure may include a single layer including iron-platinum (FePt) or cobalt-platinum (CoPt), or a bilayer structure including a first layer including cobalt (Co) or iron (Fe) or cobalt-iron (CoFe), and a second layer including platinum (Pt) or palladium (Pd) or nickel (Ni). For example, the first fixed magnetic layer structure 102 may include a bilayer or a multilayer of (Co/Pt), (Co/Pd), (Fe/Pt), (Fe/Pd), (CoFe/Pt), (CoFe/Pd) or (Co/Ni). The $(Co/Pt)_x$ multilayer, the $(Co/Pd)_x$ multilayer, the $(Fe/Pt)_x$ multilayer, the $(Fe/Pd)_x$ multilayer, the $(CoFe/Pt)_x$ multilayer, the $(CoFe/Pd)_x$ multilayer or the $(Co/Ni)_x$ multilayer (where x may be any integer) may include a plurality of a bilayer structure having a first layer of Co, Fe and CoFe respectively, and a second layer of Pt, Pd and Ni respectively. As a non-limiting example, the third fixed magnetic layer structure may include $(Co/Pd)_{15}$, of 15 layers of Co arranged alternately with 15 layers of Pd, i.e. 15 bilayer structures of (Co/Pd), i.e. (Co/Pd/Co/Pd/Co/Pd . . . /Co/Pd/Co/Pd).

Figure 2:
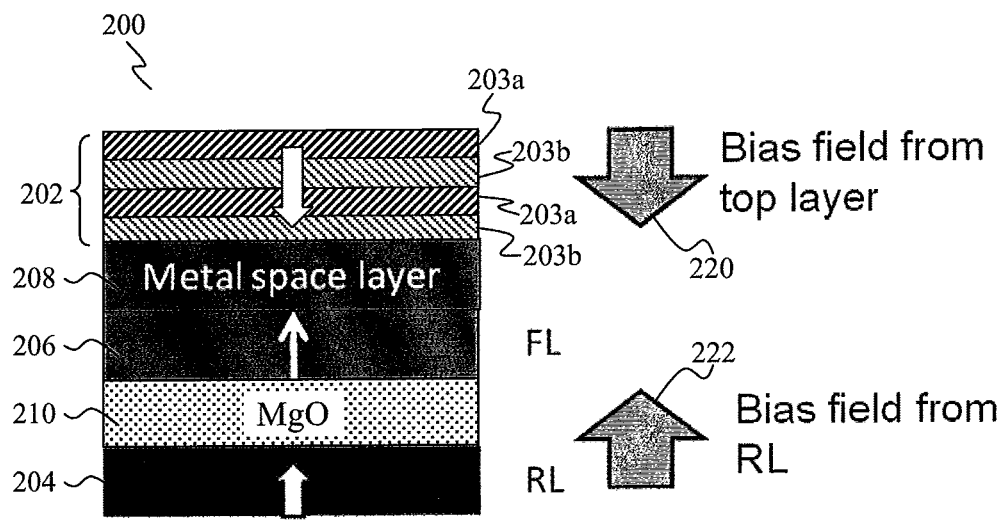
FIG. 2 shows a schematic cross-sectional view of a magnetic junction of a magnetoresistive device, according to various embodiments.

FIG. 2 shows a schematic cross-sectional view of a magnetic junction 200 of a magnetoresistive device, according to various embodiments. The magnetic junction 200 may be a magnetic junction of a giant magnetoresistive (GMR) device or a magnetic tunnel junction (MTJ) of a tunneling magnetoresistive (TMR) device, e.g. a spin transfer torque magnetic random access memory (STT-MRAM) with perpendicular anisotropy. The magnetic junction 200 has a stack structure, having for example a plurality of ferromagnetic layers.

The magnetic junction 200 includes at least three ferromagnetic layers. The magnetic junction 200 includes at least one or a fixed magnetic layer/structure (e.g. a first fixed magnetic layer structure) 202, at least one or a reference layer (denoted as "RL") (e.g. a second fixed magnetic layer structure) 204 and at least one or a free layer (denoted as "FL") (e.g. a free magnetic layer structure) 206. Each of the fixed magnetic layer/structure 202 and the reference layer 204 may be a hard magnetic layer structure having a fixed magnetization orientation. The fixed magnetic layer/structure 202 may be or may include a static fixed magnetic layer structure. The reference layer 204 may be or may include a static fixed magnetic layer structure. The free layer 206 may be a soft magnetic layer structure having a variable magnetization orientation, i.e. the magnetization orientation is changeable or switchable between different orientations or states. As a non-limiting example, FIG. 2 illustrates that the free layer 206 is arranged in between the fixed magnetic layer/structure 202 and the reference layer 204.

The fixed magnetic layer/structure 202, the reference layer 204 and the free layer 206 have their respective magnetic easy axis (e.g. magnetization orientation or direction) aligned in a perpendicular direction (i.e. perpendicular anisotropy), for example in a direction at least substantially perpendicular to a plane defined by an interface, for example an interface between the free layer 206 and the fixed magnetic layer/structure 202 or the reference layer 204.

In the context of various embodiments, the term "easy axis" as applied to magnetism may mean an energetically favorable direction of spontaneous magnetization as a result of magnetic anisotropy. The magnetization orientation may be either of two opposite directions along the easy axis.

The magnetization orientations or directions of the fixed magnetic layer/structure 202 and the reference layer 204 are aligned in a perpendicular direction (i.e. perpendicular anisotropy), for example in a direction at least substantially perpendicular to a plane defined by an interface, for example an interface between the free layer 206 and the fixed magnetic layer/structure 202 or the reference layer 204. Furthermore, the magnetization orientations or directions of the fixed magnetic layer/structure 202 and the reference layer 204 are oriented anti-parallel or in opposite directions with respect to each other. For illustration purposes, each of the magnetization orientations or directions of the fixed magnetic layer/structure 202, the reference layer 204 and the free layer 206, as represented by the respective arrows within the respective layers in FIG. 2, may point in an upward direction or a downward direction. In various embodiments, the magnetic junction 200 may offset the bias field on the free layer 206 and balance the intrinsic asymmetric writing current for the magnetic junction 200.

In various embodiments, the switching field of the fixed magnetic layer/structure 202 should be as large as possible, or at least larger than the switching field of the free layer 206.

In various embodiments, the magnetic configuration of the magnetic junction 200, for example, the respective magnetization orientations of the fixed magnetic layer/structure 202 and/or the reference layer 204 and/or the free layer 206 may be pre-set by applying a magnetic field to the magnetic junction 200.

In various embodiments, the fixed magnetic layer/structure 202 may be a bilayer structure or a multilayer structure of (Co/Pt), (Co/Pd), (Fe/Pt), (Fe/Pd), (CoFe/Pt), (CoFe/Pd) or (Co/Ni), or a single layer structure, e.g. of iron-platinum (FePt) or L10 FePt or L10 CoPt, or a composite structure which has more than one single layer. In various embodiments, the $(Co/Pt)_x$ multilayer, the $(Co/Pd)_x$ multilayer, the $(Fe/Pt)_x$ multilayer, the $(Fe/Pd)_x$ multilayer, the $(CoFe/Pt)_x$ multilayer, the $(CoFe/Pd)_x$ multilayer or the $(Co/Ni)_x$ multilayer (where x may be any integer) may include a plurality of a bilayer structure having a first layer of Co, Fe and CoFe respectively, and a second layer of Pt, Pd and Ni respectively. As non-limiting examples, the fixed magnetic layer/structure 202 may include $(Co/Pd)_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd), or $(Co/Pd)_{15}$, of 15 layers of Co arranged alternately with 15 layers of Pd, i.e. 15 bilayer structures of (Co/Pd).

As a non-limiting example as illustrated in FIG. 2, the fixed magnetic layer/structure 202 has a multilayer structure or two bilayer structures having two first layers 203a and two second layers 203b. It should be appreciated that the arrangement or positions of the two first layers 203a and two second layers 203b may be interchangeable. Each of the two first layers 203a is arranged alternately with each of the two second layers 203b. As an example, each of the two first layers 203a may be cobalt (Co) and each of the two second layers 203b may be palladium (Pd). While FIG. 2 illustrates two first layers 203a and two second layers 203b, it should be appreciated that the fixed magnetic layer/structure 202 may have any number of the first layers 203a and the second layers 203b. The thickness range of each of the first layer 203a and the second layer 203b may be between about 0.1 nm and about 0.8 nm, e.g. between about 0.1 nm and about 0.5 nm, between about 0.1 nm and about 0.3 nm or between about 0.3 nm and about 0.8 nm.

The thickness of the fixed magnetic layer/structure 202 may be between about 3 nm and about 30 nm, e.g. between about 3 nm and about 20 nm, between about 3 nm and about 10 nm, between about 10 nm and about 30 nm or between about 10 nm and about 20 nm. The thickness of the reference layer 204 may be between about 3 nm and about 30 nm, e.g. between about 3 nm and about 20 nm, between about 3 nm and about 10 nm, between about 10 nm and about 30 nm or between about 10 nm and about 20 nm. The thickness of the free layer 206 may be between about 1 nm and about 5 nm, e.g. between about 1 nm and about 3 nm, between about 1 nm and about 2 nm or between about 3 nm and about 5 nm.

In various embodiments, the reference layer 204 may include a single layer including iron-platinum (FePt) (e.g. L10 FePt) or cobalt-platinum (CoPt) (e.g. L10 CoPt), or a bilayer structure or a multilayer structure of (Co/Pt), (Co/Pd), (Fe/Pt), (Fe/Pd), (CoFe/Pt), (CoFe/Pd) or (Co/Ni), or a composite structure which has more than one single layer. In various embodiments, the $(Co/Pt)_x$ multilayer, the $(Co/Pd)_x$ multilayer, the $(Fe/Pt)_x$ multilayer, the $(Fe/Pd)_x$ multilayer, the $(CoFe/Pt)_x$ multilayer, the $(CoFe/Pd)_x$ multilayer or the $(Co/Ni)_x$ multilayer (where x may be any integer) may include a plurality of a bilayer structure having a first layer of Co, Fe and CoFe respectively, and a second layer of Pt, Pd and Ni respectively. As non-limiting examples, the reference layer 204 may include $(Co/Pd)_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd), or $(Co/Pd)_{15}$, of 15 layers of Co arranged alternately with 15 layers of Pd, i.e. 15 bilayer structures of (Co/Pd).

In various embodiments, the free layer 206 may include a single layer or a plurality of layers. The free layer 206 may include but not limited to CoFeB, CoFeB/FePt, CoFeB/CoPt, $CoFeB/(Co/Pd)_x$ or $CoFeB/(Co/Pt)_x$, where x may be any integer, for example between 1 and 15.

The magnetic junction 200 further includes a spacer layer (e.g. a first spacer layer) 208 arranged in between the fixed magnetic layer/structure 202 and the free layer 206. The spacer layer 208 has a short spin diffusion length so that spin current from the fixed magnetic layer/structure 202 may not punch through and become involved in free layer switching.

In other words, the spacer layer 208 may have a spin diffusion length configured to or that reduces, e.g. minimises interaction of a spin current from the fixed magnetic layer/structure 202 on the magnetization orientation or switching of the free layer 206. The spacer layer 208 is a non-magnetic layer, such as a conductive and non-magnetic layer, placed between the fixed magnetic layer/structure 202 and the free layer 206 for separation, e.g. tantalum (Ta), chromium (Cr), palladium (Pd), platinum (Pt), ruthenium (Ru) or other materials. The spacer layer 208 may be referred to as a metal space layer. The spacer layer 208 may also function as a seed layer to grow the fixed magnetic layer/structure 202. The spacer layer 208 may have a thickness greater than 2 nm, for example a thickness in a range of between about 2 nm and about 10 nm, e.g. between about 2 nm and about 8 nm, between about 2 nm and about 5 nm or between about 5 nm and about 10 nm.

While not shown in FIG. 2, in order to increase the bias field on the free layer 206, a magnetic layer (e.g. a magnetic layer with a high magnetization) may be arranged between the fixed magnetic layer/structure 202 and the spacer layer 208. The magnetic layer may be exchange coupled with the fixed magnetic layer/structure 202. The magnetic layer may include but not limited to cobalt-iron (CoFe) or cobalt-iron-boron (CoFeB).

The magnetic junction 200 further includes a spacer layer 210 arranged in between the reference layer 204 and the free layer 206. The spacer layer 210 is a non-magnetic layer placed between the reference layer 204 and the free layer 206 for separation, such as a non-conductive and non-magnetic layer, e.g. magnesium oxide (MgO) which may have a thickness of between about 0.5 nm and about 2 nm, alumina ($AlO_x$) which may have a thickness of between about 0.5 nm and about 2 nm, or titanium oxide ($TiO_x$) which may have a thickness of between about 0.5 nm and about 2 nm, or a conductive and non-magnetic layer, e.g. copper (Cu) which may have a thickness of between about 2 nm and about 6 nm.

In FIG. 2, the arrow 220 illustrates the bias field from the fixed magnetic layer/structure 202 on the free layer 206, while the arrow 222 illustrates the bias field from the reference layer 204 on the free layer 206. Therefore, the bias field 220 from the fixed magnetic layer/structure 202 may offset the bias field 222 from the reference layer 204 on the free layer 206. For example, the bias field 220 generated by the fixed magnetic layer/structure 202 on the free layer 206 may be larger than or at least substantially similar to (or equivalent to) the bias field 222 generated by the reference layer 204 on the free layer 206.

While FIG. 2 illustrates that the reference layer 204 is arranged beneath the fixed magnetic layer/structure 202 and the free layer 206, it should be appreciated that the fixed magnetic layer/structure 202 may instead be arranged beneath the reference layer 204 and the free layer 206.

In addition, while FIG. 2 shows that the free layer 206 is arranged or sandwiched in between the fixed magnetic layer/structure 202 and the reference layer 204, it should be appreciated that other arrangements of the layers may be possible, for example the reference layer 204 may be arranged or sandwiched in between the fixed magnetic layer/structure 202 and the free layer 206.

Figure 3:
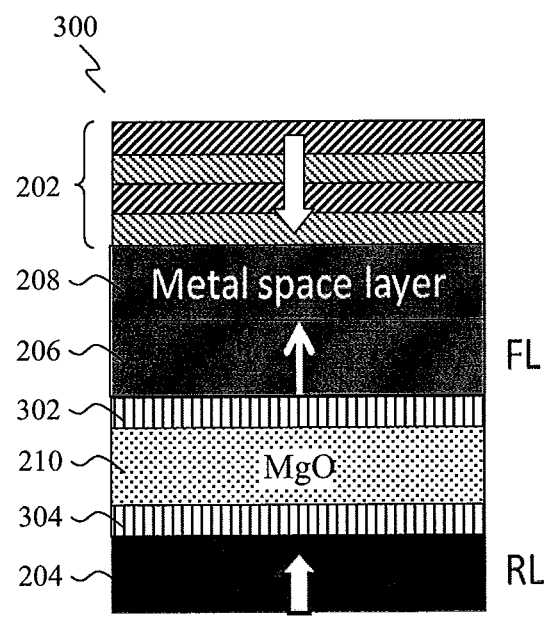
FIG. 3 shows a schematic cross-sectional view of a magnetic junction of a magnetoresistive device, according to various embodiments.

FIG. 3 shows a schematic cross-sectional view of a magnetic junction 300 of a magnetoresistive device, according to various embodiments. The magnetic junction 300 includes at least one or a fixed magnetic layer/structure 202, at least one or a reference layer 204, at least one or a free layer 206 and spacer layers 208, 210 which may be as described in the context of the embodiment of FIG. 2. In addition, the magnetic junction 200 as described in the context of the embodiment of FIG. 2 may be analogously valid for the magnetic junction 300.

The magnetic junction 300 further includes a spin enhancing layer 302 arranged adjacent to a first side of the spacer layer 210, between the free layer 206 and the spacer layer 210, and another spin enhancing layer 304 arranged adjacent to a second side of the spacer layer 210, between the reference layer 204 and the spacer layer 210, for example to achieve enhanced tunneling magnetoresistive (TMR) and spin transfer torque (STT) effects. The spin enhancing layer 302 may be in contact with the first side of the spacer layer 210 and/or the spin enhancing layer 304 may be in contact with the second side of the spacer layer 210.

Each of the spin enhancing layers 302, 304 may be a single layer of iron (Fe) or cobalt-iron (CoFe) or cobalt-iron-boron (CoFeB), for example $Co_{70}Fe_{30}$ to achieve a higher TMR as CoFe has a high spin polarization ratio, for example a higher spin polarization ratio compared to that of CoFeB. Each of the spin enhancing layers 302, 304 may also be a bilayer structure including a first layer of cobalt-iron-boron (CoFeB), and a second layer of cobalt-iron (CoFe), i.e. (CoFeB/CoFe).

Each of the spin enhancing layers 302, 304 may have a thickness of between about 0.1 nm and about 3.5 nm, e.g. between about 0.1 nm and about 3 nm, between about 0.1 nm and about 2 nm, between about 0.1 nm and about 1 nm, between about 1 nm and about 3 nm, between about 0.1 nm and about 1 nm, or between about 0.1 nm and about 0.4 nm. As non-limiting examples, a spin enhancing layer may be a single layer of CoFe of a thickness of about 0.1 nm to about 0.4 nm, a spin enhancing layer of may be a single layer of CoFeB of a thickness of about 1 nm to about 3 nm, or a spin enhancing layer may have a bilayer structure of CoFeB (thickness of 1-3 nm)/CoFe (thickness of 0.1-0.4 nm). It should be appreciated that each of the spin enhancing layers 302, 304 may not be too thick as otherwise the crystalline structure of the spacer layer 210 (e.g. MgO crystalline structure) and the tunneling mechanism may be changed, resulting in lower TMR signals.

In various embodiments for multilevel STT-MRAM designs or applications, a plurality of free layers may be provided and a plurality of magnetic layers (reference layers (e.g. 204) and/or fixed magnetic layer/structure (e.g. 202)) may be provided for tuning the bias fields on the plurality of free layers. Embodiments of magnetic junctions for multilevel STT MRAM (e.g. p-STT-MRAM) applications, having two free layers as non-limiting examples, will now be described with reference to FIGS. 4 to 7.

Figure 4:
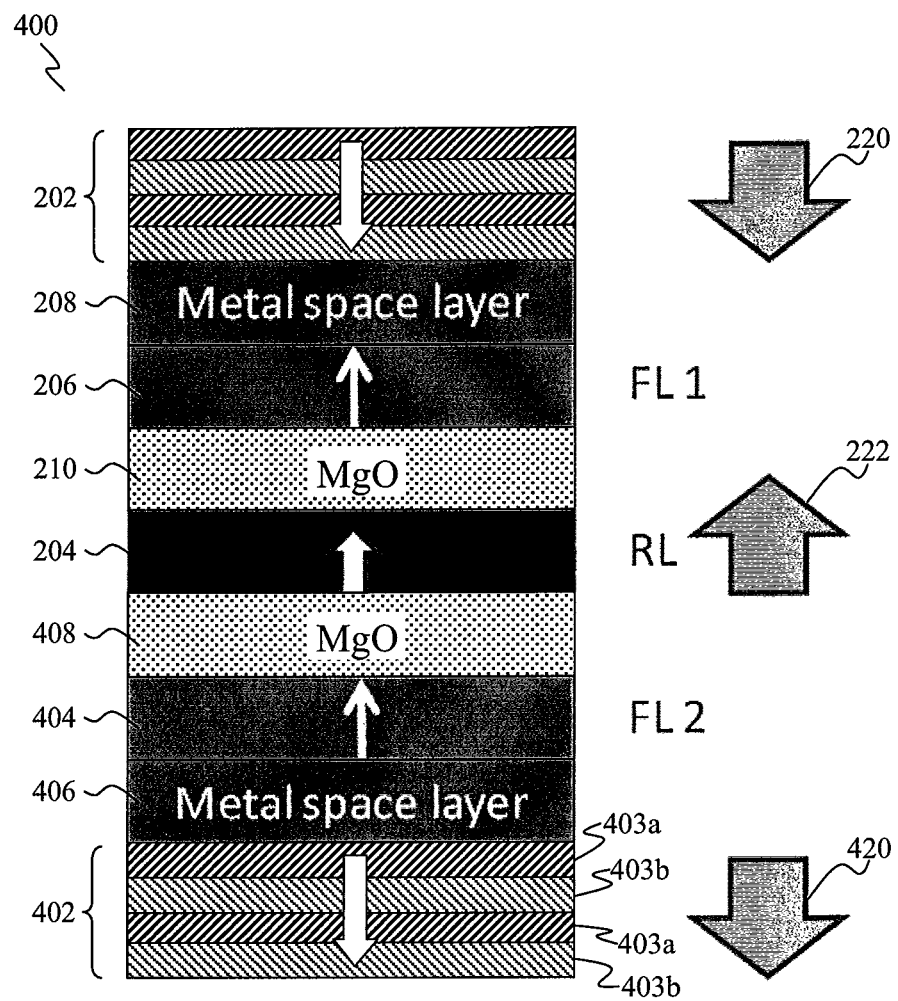
FIG. 4 shows a schematic cross-sectional view of a magnetic junction of a magnetoresistive device, according to various embodiments.

FIG. 4 shows a schematic cross-sectional view of a magnetic junction 400 of a magnetoresistive device, according to various embodiments. The magnetic junction 400 includes a fixed magnetic layer/structure 202, a reference layer (RL) 204, a free layer (FL1) 206 and spacer layers 208, 210 which may be as described in the context of the embodiment of FIG. 2. In addition, the magnetic junctions 200, 300 as described in the context of the embodiments of FIGS. 2 and 3 respectively may be analogously valid for the magnetic junction 400.

The magnetic junction 400 further includes a fixed magnetic layer/structure (e.g. a third fixed magnetic layer structure) 402 which may be a hard magnetic layer structure having a fixed magnetization orientation, and a free layer (FL2) (e.g. a second free magnetic layer structure) 404 which may be a soft magnetic layer structure having a variable magnetization orientation, i.e. the magnetization orientation is changeable or switchable between different orientations or states. The fixed magnetic layer/structure 402 may be or may include a static fixed magnetic layer structure.

The fixed magnetic layer/structure 202, the reference layer 204, the free layer 206, the fixed magnetic layer/structure 402 and the free layer 404 may be arranged one over the other. As a non-limiting example, FIG. 4 illustrates that the free layer (FL1) 206 is arranged in between the fixed magnetic layer/structure 202 and the reference layer 204, while the free layer (FL2) 404 is arranged in between the fixed magnetic layer/structure 402 and the reference layer 204.

The fixed magnetic layer/structure 402 and the free layer 404 have their respective magnetic easy axis (e.g. magnetization orientation or direction) aligned in a perpendicular direction (i.e. perpendicular anisotropy), for example in a direction at least substantially perpendicular to a plane defined by an interface, for example an interface between the free layer 206 and the fixed magnetic layer/structure 202 or the reference layer 204.

The magnetization orientation or direction of the fixed magnetic layer/structure 402 may be oriented anti-parallel or in opposite directions to the magnetization orientation of either the fixed magnetic layer/structure 202 or the reference layer 204.

For illustration purposes, each of the magnetization orientations or directions of the fixed magnetic layer/structure 202, the reference layer 204, the free layer 206, the fixed magnetic layer/structure 402 and the free layer 404, as represented by the respective arrows within the respective layers in FIG. 4, may point in an upward direction or a downward direction. As a non-limiting example, FIG. 4 illustrates that the magnetization orientations or directions of the reference layer 204, the free layer 206 and the free layer 404 point in an upward direction while the magnetization orientations or directions of the fixed magnetic layer/structure 202 and the fixed magnetic layer/structure 402 point in a downward direction.

The fixed magnetic layer/structure 402 may be a static fixed magnetic layer structure having a switching field that is larger than a switching field of the free layer 404.

In various embodiments, the fixed magnetic layer/structure 402 may be a bilayer structure or a multilayer structure of (Co/Pt), (Co/Pd), (Fe/Pt), (Fe/Pd), (CoFe/Pt), (CoFe/Pd) or (Co/Ni), or a single layer structure, e.g. of iron-platinum (FePt) or L10 FePt or L10 CoPt, or a composite structure which has more than one single layer. In various embodiments, the $(Co/Pt)_x$ multilayer, the $(Co/Pd)_x$ multilayer, the $(Fe/Pt)_x$ multilayer, the $(Fe/Pd)_x$ multilayer, the $(CoFe/Pt)_x$ multilayer, the $(CoFe/Pd)_x$ multilayer or the $(Co/Ni)_x$ multilayer (where x may be any integer) may include a plurality of a bilayer structure having a first layer of Co, Fe and CoFe respectively, and a second layer of Pt, Pd and Ni respectively. As non-limiting examples, the fixed magnetic layer/structure 402 may include $(Co/Pd)_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd), or $(Co/Pd)_{15}$, of 15 layers of Co arranged alternately with 15 layers of Pd, i.e. 15 bilayer structures of (Co/Pd).

As a non-limiting example as illustrated in FIG. 4, the fixed magnetic layer/structure 402 has a multilayer structure or two bilayer structures having two first layers 403a and two second layers 403b. It should be appreciated that the arrangement or positions of the two first layers 403a and two second layers 403b may be interchangeable. Each of the two first layers 403a is arranged alternately with each of the two second layers 403b. As an example, each of the two first layers 403a may be cobalt (Co) and each of the two second layers 403b may be palladium (Pd). While FIG. 4 illustrates two first layers 403a and two second layers 403b, it should be appreciated that the fixed magnetic layer/structure 402 may have any number of the first layers 403a and second layers 403b.

The thickness of the fixed magnetic layer/structure 402 may be between about 3 nm and about 30 nm, e.g. between about 3 nm and about 20 nm, between about 3 nm and about 10 nm, between about 10 nm and about 30 nm or between about 10 nm and about 20 nm. The thickness of the free layer 404 may be between about 1 nm and about 5 nm, e.g. between about 1 nm and about 3 nm, between about 1 nm and about 2 nm or between about 3 nm and about 5 nm.

The fixed magnetic layer/structure 202 and the fixed magnetic layer/structure 402 may have the same or different arrangements and/or materials.

In various embodiments, the free layer 404 may include a single layer or a plurality of layers. The free layer 404 may include but not limited to CoFeB, CoFeB/FePt, CoFeB/CoPt, $CoFeB/(Co/Pd)_x$ or $CoFeB/(Co/Pt)_x$, where x may be any integer, for example between 1 and 15. The free layer 206 and the free layer 404 may have the same or different arrangements and/or materials.

The magnetic junction 400 further includes a spacer layer (e.g. a third spacer layer) 406 arranged in between the fixed magnetic layer/structure 402 and the free layer 404. The spacer layer 406 may have a short spin diffusion length so that spin current from the fixed magnetic layer/structure 402 may not punch through and become involved in free layer switching. In other words, the spacer layer 406 may have a spin diffusion length configured to or that reduces, e.g. minimises interaction of a spin current from the fixed magnetic layer/structure 402 on the magnetization orientation or switching of the magnetization orientation of the free layer 404. The spacer layer 406 is a non-magnetic layer, such as a conductive and non-magnetic layer, placed between the fixed magnetic layer/structure 402 and the free layer 404 for separation, e.g. tantalum (Ta), chromium (Cr), palladium (Pd), platinum (Pt), ruthenium (Ru) or other materials. The spacer layer 406 may have a thickness greater than 2 nm, for example a thickness in a range of between about 2 nm and about 10 nm, e.g. between about 2 nm and about 8 nm, between about 2 nm and about 5 nm or between about 5 nm and about 10 nm.

The magnetic junction 400 further includes a spacer layer 408 arranged in between the reference layer 204 and the free layer 404. The spacer layer 408 is a non-magnetic layer placed between the reference layer 204 and the free layer 404 for separation, such as a non-conductive and non-magnetic layer, e.g. magnesium oxide (MgO) which may have a thickness of between about 0.5 nm and about 2 nm, alumina $(AlO_x)$ which may have a thickness of between about 0.5 nm and about 2 nm or titanium oxide $(TiO_x)$ which may have a thickness of between about 0.5 nm and about 2 nm, or a conductive and non-magnetic layer, e.g. copper (Cu) which may have a thickness of between about 2 nm and about 6 nm.

In FIG. 4, the arrow 220 illustrates the bias field from the fixed magnetic layer/structure 202 on the free layer 206, while the arrow 222 illustrates the bias field from the reference layer 204 on the free layer 206. Therefore, the bias field 220 from the fixed magnetic layer/structure 202 may offset the bias field 222 from the reference layer 204 on the free layer 206. For example, the bias field 220 generated by the fixed magnetic layer/structure 202 on the free layer 206 may be larger than or at least substantially similar to (or equivalent to) the bias field 222 generated by the reference layer 204 on the free layer 206.

In addition, the arrow 420 illustrates the bias field from the fixed magnetic layer/structure 402 on the free layer 404, while the bias field 222 from the reference layer 204 also acts on the free layer 404. Therefore, the bias field 420 from the fixed magnetic layer/structure 402 may offset the bias field 222 from the reference layer 204 on the free layer 404. For example, the bias field 420 generated by the fixed magnetic layer/structure 402 on the free layer 404 may be larger than or at least substantially similar to (or equivalent to) the bias field 222 generated by the reference layer 204 on the free layer 404.

Therefore, the reference layer 204 may generate stray fields (e.g. upward direction fields) on both free layers 206, 404, and there may be a respective fixed magnetic layer/structure with opposite magnetization orientations to that of the reference layer 204 adjacent or in proximity to a respective free layer, e.g. the fixed magnetic layer/structure 202 is adjacent to the free layer 206 while the fixed magnetic layer/structure 402 is adjacent to the free layer 404. Therefore, the bias fields on both free layers 206, 404 may be tuned.

As illustrated in FIG. 4, the number of fixed magnetic layer/structure (i.e. 202 and 402) may correspond to the number of free layers (i.e. 206 and 404).

While not shown in FIG. 4, in order to increase the bias field on the free layer 206, a magnetic layer (e.g. a magnetic layer with a high magnetization) may be arranged between the fixed magnetic layer/structure 202 and the spacer layer 208. The magnetic layer may be exchange coupled with the fixed magnetic layer/structure 202. In addition, in order to increase the bias field on the free layer 404, another magnetic layer (e.g. a magnetic layer with a high magnetization) may be arranged between the fixed magnetic layer/structure 402 and the spacer layer 406. The magnetic layer may be exchange coupled with the fixed magnetic layer/structure 402. The respective magnetic layers may include but not limited to cobalt-iron (CoFe) or cobalt-iron-boron (CoFeB).

Figure 5:
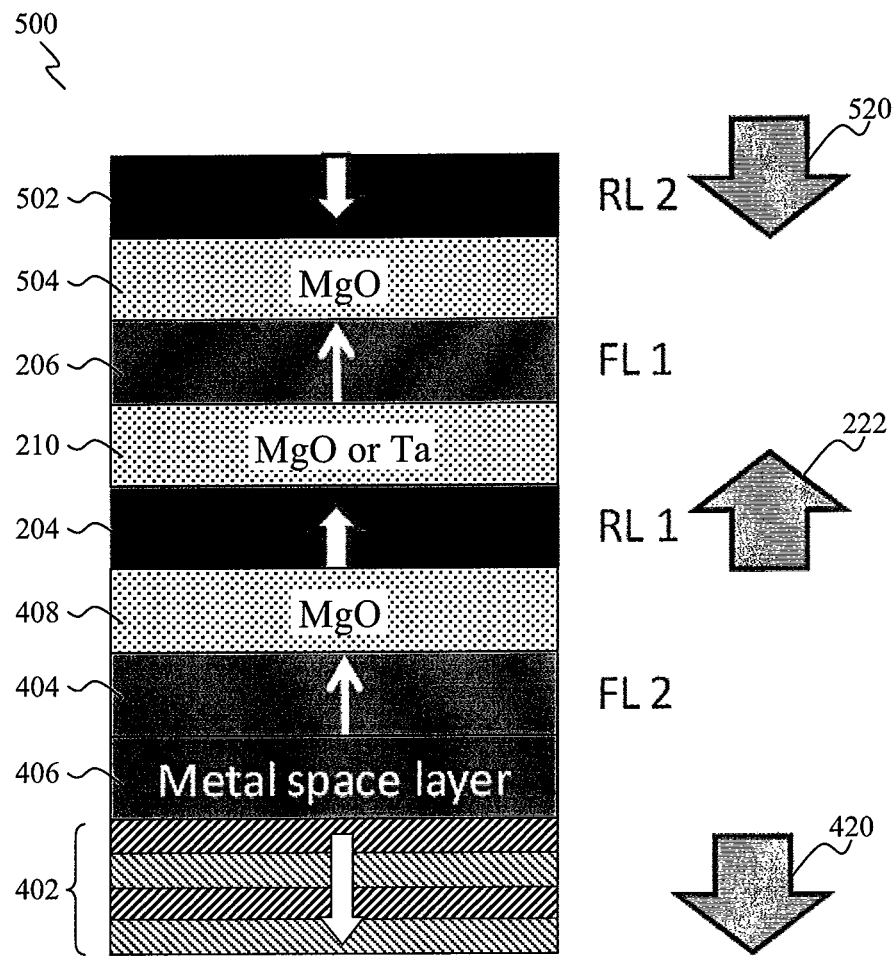
FIG. 5 shows a schematic cross-sectional view of a magnetic junction of a magnetoresistive device, according to various embodiments.

FIG. 5 shows a schematic cross-sectional view of a magnetic junction 500 of a magnetoresistive device, according to various embodiments. The magnetic junction 500 may be similar to the magnetic junction 400 of the embodiment of FIG. 4 and may be as described in the context of the magnetic junction 400, except that the fixed magnetic layer/structure 202 is replaced by another reference layer (RL2) 502, which may be or may include a static fixed magnetic layer structure, of a hard magnetic layer structure having a fixed magnetization orientation that is oriented anti-parallel or in an opposite direction to the magnetization orientation of the reference layer 204, and that the spacer layer 208 is replaced by a spacer layer 504 that is a non-magnetic layer, placed between the reference layer (RL2) 502 and the free layer (FL1) 206 for separation, e.g. a non-conductive and non-magnetic layer of magnesium oxide (MgO) which may have a thickness of between about 0.5 nm and about 2 nm, alumina ($AlO_x$) which may have a thickness of between about 0.5 nm and about 2 nm or titanium oxide ($TiO_x$) which may have a thickness of between about 0.5 nm and about 2 nm, or a conductive and non-magnetic layer of copper (Cu) which may have a thickness of between about 2 nm and about 6 nm. As shown in FIG. 5, the reference layer (RL2) 502 may be placed or arranged on top of the magnetic junction 500.

In various embodiments, the spacer layer 210 may be replaced by a spacer layer of tantalum (Ta) or other non-magnetic and conductive materials, e.g. ruthenium (Ru), palladium (Pd), or platinum (Pt), to reduce the total resistance.

In various embodiments, the reference layer 502 may include a single layer including iron-platinum (FePt) (e.g. L10 FePt) or cobalt-platinum (CoPt) (e.g. L10 CoPt), or a bilayer structure or a multilayer structure of (Co/Pt), (Co/Pd), (Fe/Pt), (Fe/Pd), (CoFe/Pt), (CoFe/Pd) or (Co/Ni), or a composite structure which has more than one single layer. In various embodiments, the $(Co/Pt)_x$ multilayer, the $(Co/Pd)_x$ multilayer, the $(Fe/Pt)_x$ multilayer, the $(Fe/Pd)_x$ multilayer, the $(CoFe/Pt)_x$ multilayer, the $(CoFe/Pd)_x$ multilayer or the $(Co/Ni)_x$ multilayer (where x may be any integer) may include a plurality of a bilayer structure having a first layer of Co, Fe and CoFe respectively, and a second layer of Pt, Pd and Ni respectively. As non-limiting examples, the reference layer 502 may include $(Co/Pd)_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd), or $(Co/Pd)_{15}$, of 15 layers of Co arranged alternately with 15 layers of Pd, i.e. 15 bilayer structures of (Co/Pd).

In FIG. 5, the arrow 520 illustrates the bias field from the reference layer 502 on the free layer 206. As the reference layer 502 has a magnetization orientation that is opposite to the magnetization orientation of the reference layer 204, the bias field on the free layer 206 may be tuned, via the respective bias fields from the reference layer 502 and the reference layer 204. Therefore, the bias field 520 from the reference layer 502 may offset the bias field 222 from the reference layer 204 on the free layer 206. For example, the bias field 520 generated by the reference layer 502 on the free layer 206 may be larger than or at least substantially similar to (or equivalent to) the bias field 222 generated by the reference layer 204 on the free layer 206.

As illustrated in FIG. 5, the number of fixed magnetic layer/structure (i.e. 402) may be less than the number of free layers (i.e. 206 and 404). For example, there may be one fixed magnetic layer/structure and two free layers in the magnetic junction 500.

While not shown in FIG. 5, in order to increase the bias field on the free layer 404, a magnetic layer (e.g. a magnetic layer with a high magnetization) may be arranged between the fixed magnetic layer/structure 402 and the spacer layer 406. The magnetic layer may be exchange coupled with the fixed magnetic layer/structure 402. The magnetic layer may include but not limited to cobalt-iron (CoFe) or cobalt-iron-boron (CoFeB).

Figure 6:
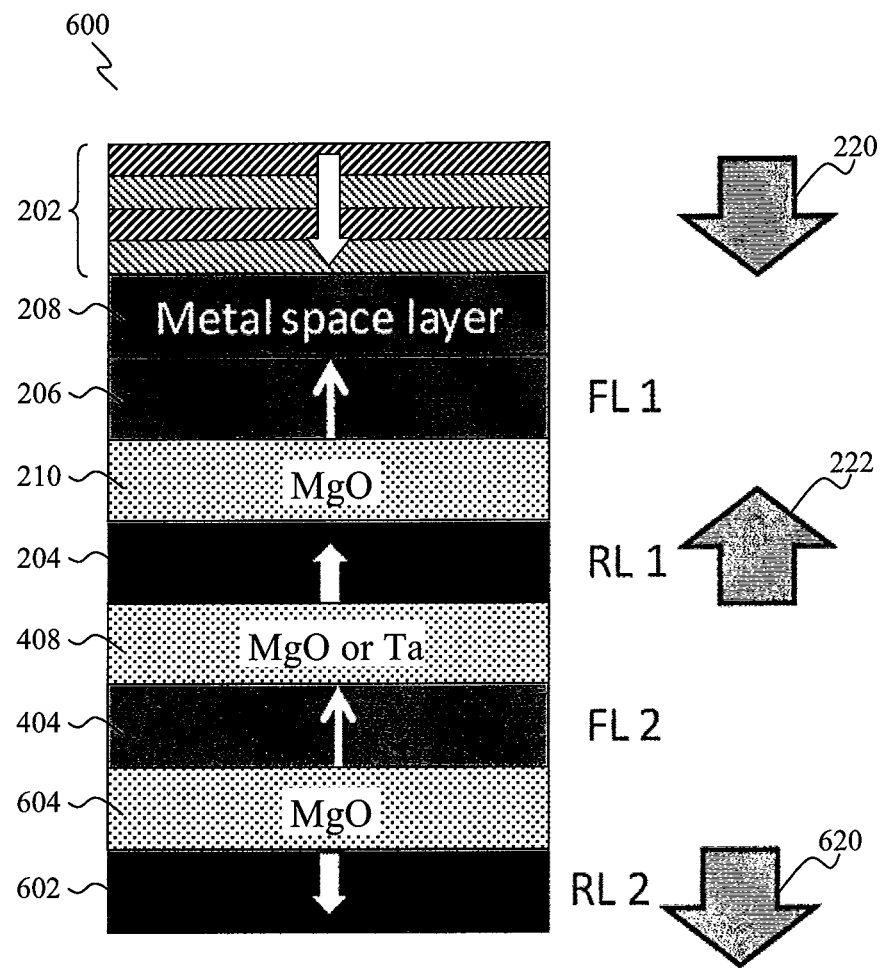
FIG. 6 shows a schematic cross-sectional view of a magnetic junction of a magnetoresistive device, according to various embodiments.

FIG. 6 shows a schematic cross-sectional view of a magnetic junction 600 of a magnetoresistive device, according to various embodiments. The magnetic junction 600 may be similar to the magnetic junction 400 of the embodiment of FIG. 4 and may be as described in the context of the magnetic junction 400, except that the fixed magnetic layer/structure 402 is replaced by another reference layer (RL2) 602, which may be or may include a static fixed magnetic layer structure, of a hard magnetic layer structure having a fixed magnetization orientation that is oriented anti-parallel or in an opposite direction to the magnetization orientation of the reference layer 204, and that the spacer layer 406 is replaced by a spacer layer 604 that is a non-magnetic layer, placed between the reference layer (RL2) 602 and the free layer (FL2) 404 for separation, e.g. a non-conductive and non-magnetic layer of magnesium oxide (MgO) which may have a thickness of between about 0.5 nm and about 2 nm, alumina ($AlO_x$) which may have a thickness of between about 0.5 nm and about 2 nm or titanium oxide ($TiO_x$) which may have a thickness of between about 0.5 nm and about 2 nm, or a conductive and non-magnetic layer of copper (Cu) which may have a thickness of between about 2 nm and about 6 nm. As shown in FIG. 6, the reference layer (RL2) 602 may be placed or arranged at the bottom of the magnetic junction 600.

In various embodiments, the spacer layer 408 may be replaced by a spacer layer of tantalum (Ta) or other non-magnetic and conductive materials, e.g. ruthenium (Ru), palladium (Pd), or platinum (Pt), to reduce the total resistance.

In various embodiments, the reference layer 602 may include a single layer including iron-platinum (FePt) (e.g. L10 FePt) or cobalt-platinum (CoPt) (e.g. L10 CoPt), or a bilayer structure or a multilayer structure of (Co/Pt), (Co/Pd), (Fe/Pt), (Fe/Pd), (CoFe/Pt), (CoFe/Pd) or (Co/Ni), or a composite structure which has more than one single layer. In various embodiments, the (Co/Pt)$_x$ multilayer, the (Co/Pd)$_x$ multilayer, the (Fe/Pt)$_x$ multilayer, the (Fe/Pd)$_x$ multilayer, the (CoFe/Pt)$_x$ multilayer, the (CoFe/Pd)$_x$ multilayer or the (Co/Ni)$_x$ multilayer (where x may be any integer) may include a plurality of a bilayer structure having a first layer of Co, Fe and CoFe respectively, and a second layer of Pt, Pd and Ni respectively. As non-limiting examples, the reference layer 602 may include (Co/Pd)$_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd), or (Co/Pd)$_{15}$, of 15 layers of Co arranged alternately with 15 layers of Pd, i.e. 15 bilayer structures of (Co/Pd).

In FIG. 6, the arrow 620 illustrates the bias field from the reference layer 602 on the free layer 404. As the reference layer 602 has a magnetization orientation that is opposite to the magnetization orientation of the reference layer 204, the bias field on the free layer 404 may be tuned, via the respective bias fields from the reference layer 602 and the reference layer 204. Therefore, the bias field 620 from the reference layer 602 may offset the bias field 222 from the reference layer 204 on the free layer 404. For example, the bias field 620 generated by the reference layer 602 on the free layer 404 may be larger than or at least substantially similar to (or equivalent to) the bias field 222 generated by the reference layer 204 on the free layer 404.

As illustrated in FIG. 6, the number of fixed magnetic layer/structure (i.e. 202) may be less than the number of free layers (i.e. 206 and 404). For example, there may be one fixed magnetic layer/structure and two free layers in the magnetic junction 600.

While not shown in FIG. 6, in order to increase the bias field on the free layer 206, a magnetic layer (e.g. a magnetic layer with a high magnetization) may be arranged between the fixed magnetic layer/structure 202 and the spacer layer 208. The magnetic layer may be exchange coupled with the fixed magnetic layer/structure 202. The magnetic layer may include but not limited to cobalt-iron (CoFe) or cobalt-iron-boron (CoFeB).

Figure 7:
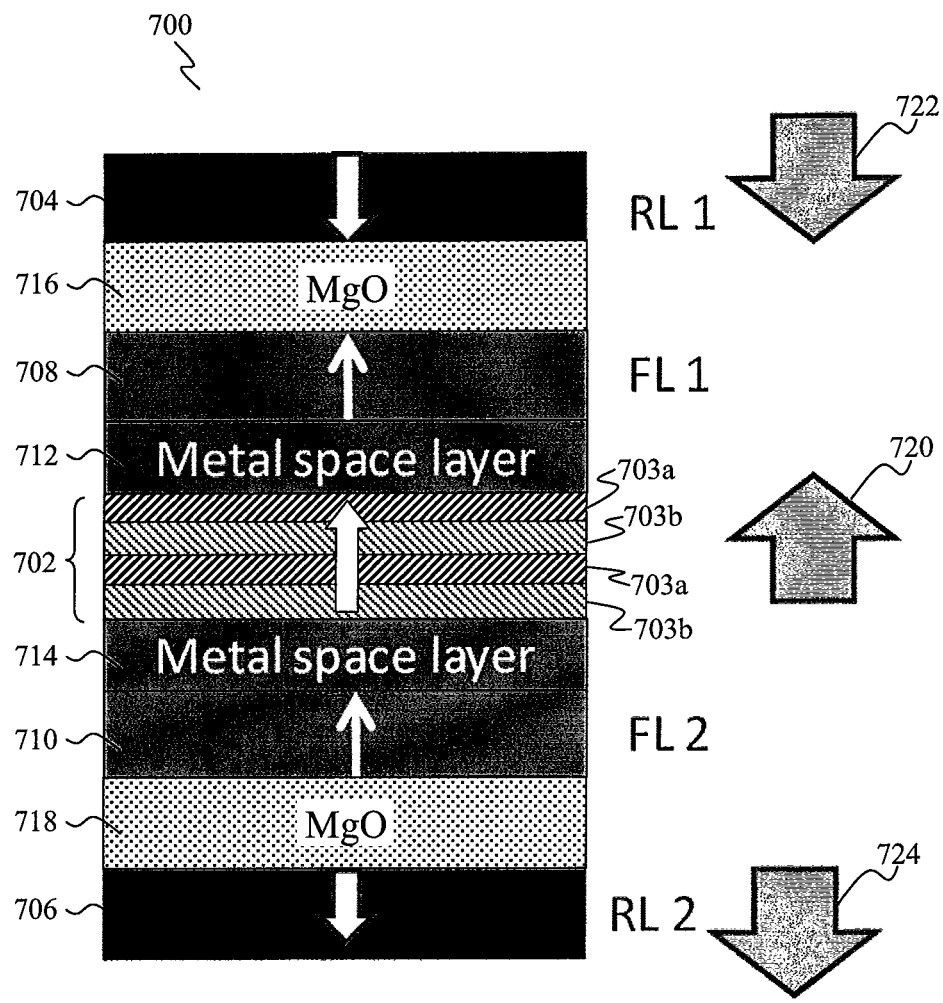
FIG. 7 shows a schematic cross-sectional view of a magnetic junction of a magnetoresistive device, according to various embodiments.

FIG. 7 shows a schematic cross-sectional view of a magnetic junction 700 of a magnetoresistive device, according to various embodiments.

The magnetic junction 700 includes a fixed magnetic layer/structure 702, a reference layer (RL1) 704, another reference layer (RL2) 706, a free layer (FL1) 708 and another free layer (FL2) 710. Each of the fixed magnetic layer/structure 702 and the reference layers 704, 706 may be a hard magnetic layer structure having a fixed magnetization orientation. Each of the fixed magnetic layer/structure 702 and the reference layers 704, 706 may be or may include a static fixed magnetic layer structure. Each of the free layers 708, 710 may be a soft magnetic layer structure having a variable magnetization orientation, i.e. the magnetization orientation is changeable or switchable between different orientations or states.

The fixed magnetic layer/structure 702, the reference layer (RL1) 704, the reference layer (RL2) 706, the free layer (FL1) 708 and the free layer (FL2) 710 may be arranged one over the other. As a non-limiting example, FIG. 7 illustrates that the free layer (FL1) 708 is arranged in between the reference layer (RL1) 704 and the fixed magnetic layer/structure 702, while the free layer (FL2) 710 is arranged in between the fixed magnetic layer/structure 702 and the reference layer (RL2) 706.

The fixed magnetic layer/structure 702, the reference layer (RL1) 704, the reference layer (RL2) 706, the free layer (FL1) 708 and the free layer (FL2) 710 have their respective magnetic easy axis (e.g. magnetization orientation or direction) aligned in a perpendicular direction (i.e. perpendicular anisotropy), for example in a direction at least substantially perpendicular to a plane defined by an interface, for example an interface between the free layer (FL1) 708 and the fixed magnetic layer/structure 702 or between the free layer (FL2) 710 and the fixed magnetic layer/structure 702.

The magnetization orientation or direction of the fixed magnetic layer/structure 702 may be oriented anti-parallel or in opposite directions to the magnetization orientation of the reference layer (RL1) 704 and the reference layer (RL2) 706.

For illustration purposes, each of the magnetization orientations or directions of the fixed magnetic layer/structure 702, the reference layer (RL1) 704, the reference layer (RL2) 706, the free layer (FL1) 708 and the free layer (FL2) 710, as represented by the respective arrows within the respective layers in FIG. 7, may point in an upward direction or a downward direction. As a non-limiting example, FIG. 7 illustrates that the magnetization orientations or directions of the fixed magnetic layer/structure 702, the free layer (FL1) 708 and the free layer (FL2) 710 point in an upward direction while the magnetization orientations or directions of the reference layer (RL1) 704 and the reference layer (RL2) 706 point in a downward direction.

The fixed magnetic layer/structure 702 may have a switching field that is larger than a switching field of each of the free layers 708, 710.

In various embodiments, the fixed magnetic layer/structure 702 may be a bilayer structure or a multilayer structure of (Co/Pt), (Co/Pd), (Fe/Pt), (Fe/Pd), (CoFe/Pt), (CoFe/Pd) or (Co/Ni), or a single layer structure, e.g. of iron-platinum (FePt) or L10 FePt or L10 CoPt, or a composite structure which has more than one single layer. In various embodiments, the (Co/Pt)$_x$ multilayer, the (Co/Pd)$_x$ multilayer, the (Fe/Pt)$_x$ multilayer, the (Fe/Pd)$_x$ multilayer, the (CoFe/Pt)$_x$ multilayer, the (CoFe/Pd)$_x$ multilayer or the (Co/Ni)$_x$ multilayer (where x may be any integer) may include a plurality of a bilayer structure having a first layer of Co, Fe and CoFe respectively, and a second layer of Pt, Pd and Ni respectively. As non-limiting examples, the fixed magnetic layer/structure 702 may include (Co/Pd)$_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd), or (Co/Pd)$_{15}$, of 15 layers of Co arranged alternately with 15 layers of Pd, i.e. 15 bilayer structures of (Co/Pd).

As a non-limiting example as illustrated in FIG. 7, the fixed magnetic layer/structure 702 has a multilayer structure or two bilayer structures having two first layers 703a and two second layers 703b. It should be appreciated that the arrangement or positions of the two first layers 703a and two second layers 703b may be interchangeable. Each of the two first layers 703a is arranged alternately with each of the two second layers 703b. As an example, each of the two first layers 703a may be cobalt (Co) and each of the two second layers 703b may be palladium (Pd). While FIG. 7 illustrates two first layers 703a and two second layers 703b, it should be appreciated that the fixed magnetic layer/structure 702 may have any number of the first layers 703a and second layers 703b. The thickness range of each of the first layer 703a and the second layer 703b may be between about 0.1 nm and about 0.8 nm, e.g. between about 0.1 nm and about 0.5 nm, between about 0.1 nm and about 0.3 nm or between about 0.3 nm and about 0.8 nm.

In various embodiments, each of or any one of the reference layers 704, 706 may include a single layer including iron-platinum (FePt) (e.g. L10 FePt) or cobalt-platinum (CoPt) (e.g. L10 CoPt), or a bilayer structure or a multilayer structure of (Co/Pt), (Co/Pd), (Fe/Pt), (Fe/Pd), (CoFe/Pt), (CoFe/Pd) or (Co/Ni), or a composite structure which has more than one single layer. In various embodiments, the $(Co/Pt)_x$ multilayer, the $(Co/Pd)_x$ multilayer, the $(Fe/Pt)_x$ multilayer, the $(Fe/Pd)_x$ multilayer, the $(CoFe/Pt)_x$ multilayer, the $(CoFe/Pd)_x$ multilayer or the $(Co/Ni)_x$ multilayer (where x may be any integer) may include a plurality of a bilayer structure having a first layer of Co, Fe and CoFe respectively, and a second layer of Pt, Pd and Ni respectively. As non-limiting examples, each of or any one of the reference layers 704, 706 may include $(Co/Pd)_5$, of 5 layers of Co arranged alternately with 5 layers of Pd, i.e. 5 bilayer structures of (Co/Pd), i.e. (Co/Pd/Co/Pd/Co/Pd/Co/Pd/Co/Pd), or $(Co/Pd)_{15}$, of 15 layers of Co arranged alternately with 15 layers of Pd, i.e. 15 bilayer structures of (Co/Pd).

In various embodiments, each of or any one of the free layers 708, 710 may include a single layer or a plurality of layers. Each of or any one of the free layers 708, 710 may include but not limited to CoFeB, CoFeB/FePt, CoFeB/CoPt, $CoFeB/(Co/Pd)_x$ or $CoFeB/(Co/Pt)_x$, where x may be any integer, for example between 1 and 15. The free layers 708, 710 may have the same or different arrangements and/or materials.

The magnetic junction 700 further includes a spacer layer 712 arranged in between the fixed magnetic layer/structure 702 and the free layer (FL1) 708, and a spacer layer 714 arranged in between the fixed magnetic layer/structure 702 and the free layer (FL2) 710.

The spacer layer 712 may have a short spin diffusion length so that spin current from the fixed magnetic layer/structure 702 may not punch through and become involved in free layer switching. In other words, the spacer layer 712 may have a spin diffusion length configured to or that reduces, e.g. minimises interaction of a spin current from the fixed magnetic layer/structure 702 on the magnetization orientation or switching of the magnetization orientation of the free layer (FL1) 708. The spacer layer 712 is a non-magnetic layer, such as a conductive and non-magnetic layer, placed between the fixed magnetic layer/structure 702 and the free layer (FL1) 708 for separation, e.g. tantalum (Ta), chromium (Cr), palladium (Pd), platinum (Pt), ruthenium (Ru) or other materials. The spacer layer 712 may have a thickness greater than 2 nm, for example a thickness in a range of between about 2 nm and about 10 nm, e.g. between about 2 nm and about 8 nm, between about 2 nm and about 5 nm or between about 5 nm and about 10 nm.

The spacer layer 714 may have a short spin diffusion length so that spin current from the fixed magnetic layer/structure 702 may not punch through and become involved in free layer switching. In other words, the spacer layer 714 may have a spin diffusion length configured to or that reduces, e.g. minimises interaction of a spin current from the fixed magnetic layer/structure 702 on the magnetization orientation or switching of the magnetization orientation of the free layer (FL2) 710. The spacer layer 714 is a non-magnetic layer, such as a conductive and non-magnetic layer, placed between the fixed magnetic layer/structure 702 and the free layer (FL2) 710 for separation, e.g. tantalum (Ta), chromium (Cr), palladium (Pd), platinum (Pt), ruthenium (Ru) or other materials. The spacer layer 714 may have a thickness greater than 2 nm, for example a thickness in a range of between about 2 nm and about 10 nm, e.g. between about 2 nm and about 8 nm, between about 2 nm and about 5 nm or between about 5 nm and about 10 nm.

The magnetic junction 700 further includes a spacer layer 716 arranged in between the reference layer (RL1) 704 and the free layer (FL1) 708, and a spacer layer 718 arranged in between the reference layer (RL2) 706 and the free layer (FL2) 710.

The spacer layer 716 is a non-magnetic layer placed between the reference layer (RL1) 704 and the free layer (FL1) 708 for separation, such as a non-conductive and non-magnetic layer e.g. magnesium oxide (MgO), alumina ($AlO_x$) or titanium oxide ($TiO_x$), or a conductive and non-magnetic layer e.g. copper (Cu). The spacer layer 718 is a non-magnetic layer placed between the reference layer (RL2) 706 and the free layer (FL2) 710 for separation, such as a non-conductive and non-magnetic layer e.g. magnesium oxide (MgO), alumina ($AlO_x$) or titanium oxide ($TiO_x$), or a conductive and non-magnetic layer e.g. copper (Cu). In various embodiments, the layer of magnesium oxide (MgO) may have a thickness of between about 0.5 nm and about 2 nm, the layer of alumina ($AlO_x$) may have a thickness of between about 0.5 nm and to about 2 nm, the layer of titanium oxide ($TiO_x$) may have a thickness of between about 0.5 nm and about 2 nm, while the layer of copper (Cu) may have a thickness of between about 2 nm and about 6 nm.

In FIG. 7, the arrow 720 illustrates the bias field from the fixed magnetic layer/structure 702 on each of the free layers 708, 710, while the arrow 722 illustrates the bias field from the reference layer (RL1) 704 on the free layer (FL1) 708 and the arrow 724 illustrates the bias field from the reference layer (RL2) 706 on the free layer (FL2) 710. Therefore, the bias field 720 from the fixed magnetic layer/structure 702 may offset the bias field 722 from the reference layer (RL1) 704 on the free layer (FL1) 708, and may offset the bias field 724 from the reference layer (RL2) 706 on the free layer (FL2) 710. For example, the bias field 720 generated by the fixed magnetic layer/structure 702 on the free layer 708 may be larger than or at least substantially similar to (or equivalent to) the bias field 722 generated by the reference layer 704 on the free layer 708, and/or the bias field 720 generated by the fixed magnetic layer/structure 702 on the free layer 710 may be larger than or at least substantially similar to (or equivalent to) the bias field 724 generated by the reference layer 706 on the free layer 710.

As illustrated in FIG. 7, the number of fixed magnetic layer/structure (i.e. 702) may be less than the number of free layers (i.e. 708 and 710). The two free layers 708, 710 may share one fixed magnetic layer/structure 702 arranged in the middle of the magnetic junction 700 to offset the bias fields from the reference layers 704, 706 arranged respectively on the top and at the bottom of the magnetic junction 700.

While not shown in FIG. 7, in order to increase the bias field on the free layer 708, a magnetic layer (e.g. a magnetic layer with a high magnetization) may be arranged between the fixed magnetic layer/structure 702 and the spacer layer 712. The magnetic layer may be exchange coupled with the fixed magnetic layer/structure 702. In addition, in order to increase the bias field on the free layer 710, another magnetic layer (e.g. a magnetic layer with a high magnetization) may be arranged between the fixed magnetic layer/structure 702 and the spacer layer 714. The magnetic layer may be exchange coupled with the fixed magnetic layer/structure 702. The respective magnetic layers may include but not limited to cobalt-iron (CoFe) or cobalt-iron-boron (CoFeB).

In the context of various embodiments, where there is a bias field in a free layer, there should be a magnetic layer (e.g. a fixed magnetic layer/structure or a reference layer) with an opposite magnetization orientation to provide an opposite bias field to offset the bias field present in the free layer.

In the context of various embodiments of multilevel STT-MRAM designs, the number of free layers may be larger than the number of magnetic layer(s)/structure(s), which may be used to offset the bias field on the free layers, for example as illustrated by the magnetic junction 700 of FIG. 7.

In the context of the embodiments of the magnetic junctions 400, 500, 600, 700, different spacer layers 210, 408, 504, 604, 716, 718, may have different thicknesses.

In the context of the embodiments of the magnetic junctions 400, 500, 600, 700, the spin enhancing layers 302, 304 as described in the context of the magnetic junction 300 may be provided for each or any one of the spacer layers 210, 408, 504, 604, 716, 718.

The magnetoresistive device of various embodiments, including a magnetic junction having at least one fixed magnetic layer/structure (e.g. 202, 402, 702) may have at least one or more of the following advantages:

(i) The bias field on the free layer (e.g. 206, 404, 708, 710) may be tuned and minimised or eliminated. In addition, the switching current density of the free layer may be or become more symmetrical.

As the magnetization of the fixed magnetic layer/structure (e.g. 202, 402, 702) is anti-parallel with that of the reference layer (e.g. 204, 502, 602, 704, 706), the effective bias field on the free layer (e.g. 206, 404, 708, 710) may be minimised or cancelled and off-set to zero or approaching zero. In various embodiments, the fixed magnetic layer/structure (e.g. 202, 402, 702) may generate a bias field that is larger than the one originating from the reference layer (e.g. 204, 502, 602, 704, 706).

Figure 8:
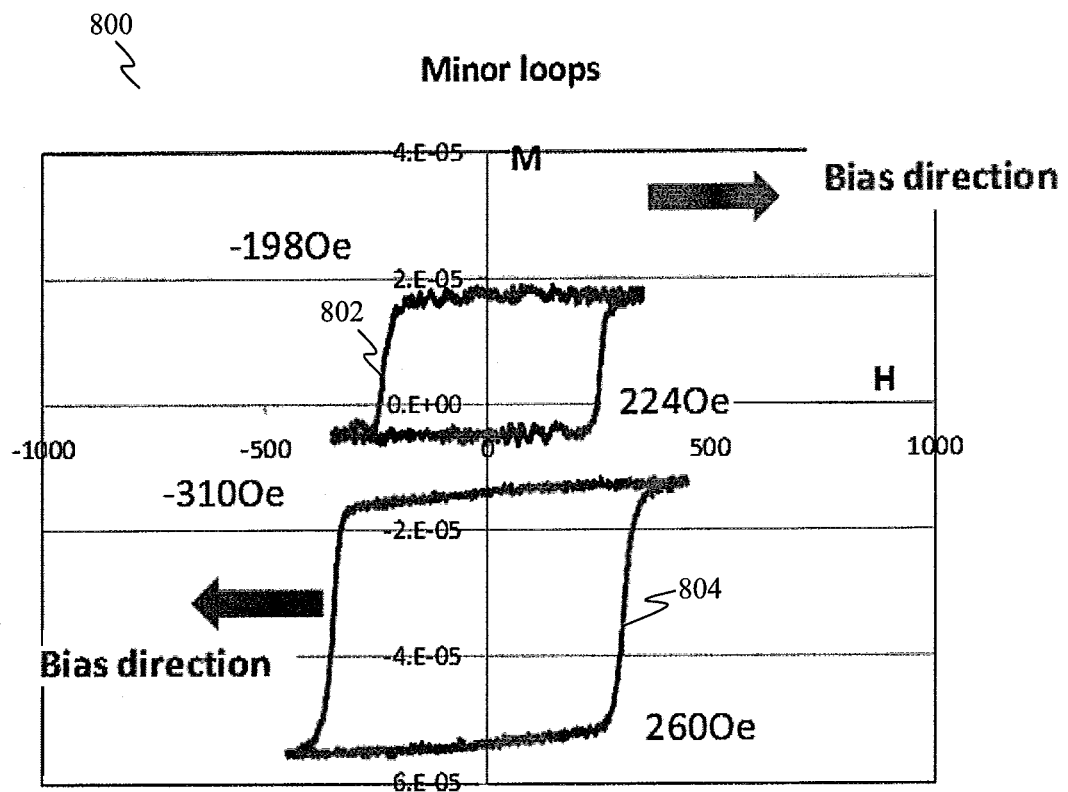
FIG. 8 shows a plot of bias fields on the free layer for a magnetoresistive device of various embodiments and a conventional magnetoresistive device.
Figure 8:
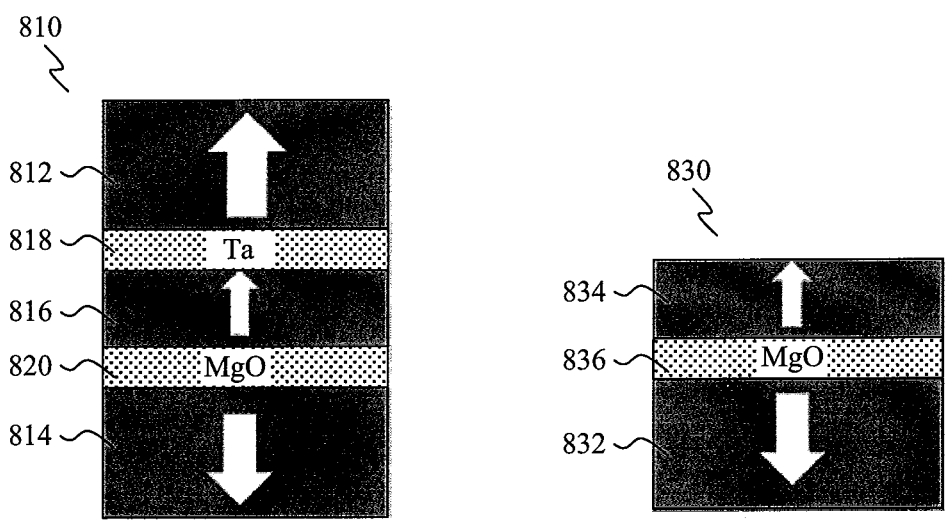

FIG. 8 shows a plot 800 of bias fields on the free layer for a magnetoresistive device of various embodiments and a conventional magnetoresistive device. The plot 800 shows the measurement result of the hysteresis loop 802 for the bias field on the free layer for a magnetoresistive device of various embodiments having a fixed magnetic layer/structure (e.g. 202, 402, 702) and the measurement result of the hysteresis loop 804 for the bias field on the free layer for a conventional magnetoresistive device.

The hysteresis loop 802 is obtained for a magnetoresistive device using a sheet film sample, having a magnetic junction 810. The magnetic junction 810 includes a fixed magnetic layer/structure 812 which may be a hard magnetic layer structure having a fixed magnetization orientation, a reference layer 814 which may be a hard magnetic layer structure having a fixed magnetization orientation, and a free layer 816 which may be a soft magnetic layer structure having a variable magnetization orientation. The fixed magnetic layer/structure 812 may be or may include a static fixed magnetic layer structure.

As examples, the fixed magnetic layer/structure 812 may be similar to and as described in the context of the fixed magnetic layer/structure 202 (FIG. 2), the reference layer 814 may be similar to and as described in the context of the reference layer 204 (FIG. 2) and the free layer 816 may be similar to and as described in the context of the free layer 206 (FIG. 2).

The magnetization orientations or directions of the fixed magnetic layer/structure 812, the reference layer 814 and the free layer 816 are aligned in a perpendicular direction (i.e. perpendicular anisotropy), in a direction at least substantially perpendicular to a plane defined by an interface between the free layer 816 and the fixed magnetic layer/structure 812 or the reference layer 814.

For illustration purposes, each of the magnetization orientations or directions of the fixed magnetic layer/structure 812 and the free layer 816, as represented by the respective arrows within the respective layers in FIG. 8, may point in an upward direction, while the magnetization orientation or direction of the reference layer 814, as represented by the arrow within the reference layer 814 in FIG. 8, may point in a downward direction, being anti-parallel to that of the fixed magnetic layer/structure 812.

The free layer 816 is arranged between the fixed magnetic layer/structure 812 and the reference layer 814. The magnetic junction 810 further includes a spacer layer 818, e.g. a tantalum (Ta) layer, between the fixed magnetic layer/structure 812 and the free layer 816, and another spacer layer 820, e.g. a magnesium oxide (MgO) layer, between the free layer 816 and the reference layer 814.

The hysteresis loop 804 is obtained for a conventional magnetoresistive device using a sheet film sample, having a magnetic junction 830. The magnetic junction 830 includes a reference layer 832 which is a hard magnetic layer structure having a fixed magnetization orientation, a free layer 834 which is a soft magnetic layer structure having a variable magnetization orientation, and a MgO spacer layer 836 sandwiched between the reference layer 832 and the free layer 834.

The magnetization orientations or directions of the reference layer 832 and the free layer 834 are aligned in a perpendicular direction (i.e. perpendicular anisotropy), in a direction at least substantially perpendicular to a plane defined by an interface between the reference layer 832 and the free layer 834. For illustration purposes, the magnetization orientation of the reference layer 832 points in a downward direction while the magnetization orientation of the free layer 834 points in an upward direction.

As illustrated in the plot 800, the hysteresis loop 802 is smaller for the magnetoresistive device of various embodiments, compared to the hysteresis loop 804 for a conventional magnetoresistive device. In addition, the hysteresis loop 804 for the free layer 834 of the conventional magnetic junction 830 is biased to the left side, which may be offset or biased towards the right side, as illustrated by hysteresis loop 802 for the free layer 816 of the magnetic junction 810 having the fixed magnetic layer/structure 812.

(ii) The current asymmetry caused by majority spin and minority spin may be reduced by tuning the bias fields from the reference layer (e.g. 204, 502, 602, 704, 706) and the fixed magnetic layer/structure (e.g. 202, 402, 702).

The bias field from the fixed magnetic layer/structure (e.g. 202, 402, 702) may be tuned and may over shoot or overcome the bias field from the reference layer (e.g. 204, 502, 602, 704, 706). As the bias field from the fixed magnetic layer/structure (e.g. 202, 402, 702) may help parallel (P) to antiparallel (AP) switching (P→AP), the switching currents for antiparallel (AP) to parallel (P) switching (AP→P) and P→AP switching may be symmetrically defined.

(iii) The area-resistance (RA), the tunneling magnetoresistance or magnetoresistive (TMR) and spin torque properties may not be affected in embodiments where the spacer layer (e.g. 208, 406, 712, 714) may be thick, for example having a thickness greater than 2 nm, and/or with a short diffusion length, for example of a material such as tantalum (Ta) or chromium (Cr). Any device or system having the magnetoresistive device of various embodiments may be simple and may not include or require any additional circuit design, which is helpful for uniformity control of the RA, TMR, critical current (Jc), among others.

In addition, the spin-electron effect may be filtered by such a non-magnetic spacer layer (e.g. 208, 406, 712, 714). Other than the field effect from the fixed magnetic layer/structure (e.g. 202, 402, 702), there may not be extra magnetoresistive and spin torque effect involved in TMR output and free layer switching. Therefore, the magnetic junction stack structure of various embodiments is clean and simple in comparison with other conventional magnetic junction stack structure. Furthermore, more materials may be chosen to match the film growth for the fixed magnetic layer/structure (e.g. 202, 402, 702), such as a chromium (Cr) seed layer for L10 phase FePt deposition, for example.

(iv) There may be minimum change impact on the established fabrication process. The magnetic junction of the magnetoresistive device of various embodiments may be about 8 nm thicker than a conventional design, and the fabrication process for forming the magnetic junction of various embodiments may remain the same, for example, patterning process, followed by ion-milling and passivation.

(v) A one stop thin film/stack deposition process may be provided. For example, the layers or structures may be directly deposited on top of the free layer (e.g. 206, 404, 708, 710) by sputtering without stop (breaking the vacuum) during the manufacturing process.

While the preferred embodiments of the devices and methods have been described in reference to the environment in which they were developed, they are merely illustrative of the principles of the inventions. Other embodiments and configurations may be devised without departing from the spirit of the inventions and the scope of the appended claims.

We claim:

1. A magnetoresistive device having a magnetic junction, the magnetic junction comprising:
    a first fixed magnetic layer structure having a fixed magnetization orientation;
    a second fixed magnetic layer structure having a fixed magnetization orientation; and
    a free magnetic layer structure having a variable magnetization orientation;
    wherein the first fixed magnetic layer structure, the second fixed magnetic layer structure and the free magnetic layer structure are arranged one over the other,
    wherein the first fixed magnetic layer structure, the second fixed magnetic layer structure and the free magnetic layer structure have respective magnetization orientations configured to orient in a direction at least substantially perpendicular to a plane defined by an interface between the free magnetic layer structure and either one of the first fixed magnetic layer structure or the second fixed magnetic layer structure,
    wherein the respective magnetization orientations of the first fixed magnetic layer structure and the second fixed magnetic layer structure are oriented anti-parallel to each other, and
    wherein the first fixed magnetic layer structure is a static fixed magnetic layer structure having a switching field that is larger than a switching field of the free magnetic layer structure.

2. The magnetoresistive device as claimed in claim 1, wherein the first fixed magnetic layer structure is configured to generate a bias field on the free magnetic layer structure that is larger than or at least substantially similar to a bias field generated by the second fixed magnetic layer structure.

3. The magnetoresistive device as claimed in claim 1, wherein the first fixed magnetic layer structure comprises a single layer comprising iron-platinum or cobalt-platinum or a bilayer structure comprising a first layer comprising cobalt or iron or cobalt-iron, and a second layer comprising platinum or palladium or nickel.

4. The magnetoresistive device as claimed in claim 1, wherein the free magnetic layer structure is arranged between the first fixed magnetic layer structure and the second fixed magnetic layer structure.

5. The magnetoresistive device as claimed in claim 1, wherein the magnetic junction further comprises a first spacer layer arranged between the first fixed magnetic layer structure and the free magnetic layer structure, the first spacer layer having a spin diffusion length configured to reduce interaction of a spin current from the first fixed magnetic layer structure on the magnetization orientation of the free magnetic layer structure.

6. The magnetoresistive device as claimed in claim 5, wherein the first spacer layer comprises a conductive and non-magnetic material.

7. The magnetoresistive device as claimed in claim 5, wherein the first spacer layer comprises a material selected from the group consisting of tantalum, chromium, palladium, platinum and ruthenium.

8. The magnetoresistive device as claimed in claim 5, wherein the first spacer layer has a thickness greater than 2 nm.

9. The magnetoresistive device as claimed in claim 5, wherein the magnetic junction further comprises a magnetic layer arranged between the first fixed magnetic layer structure and the first spacer layer, wherein the magnetic layer is exchange coupled with the first fixed magnetic layer structure.

10. The magnetoresistive device as claimed in claim 1, wherein the magnetic junction further comprises a second spacer layer arranged between the second fixed magnetic layer structure and the free magnetic layer structure.

11. The magnetoresistive device as claimed in claim 10, wherein the second spacer layer comprises a non-magnetic material.

12. The magnetoresistive device as claimed in claim 10, wherein the magnetic junction further comprises:
    a first spin enhancing layer arranged adjacent to a first side of the second spacer layer; and
    a second spin enhancing layer arranged adjacent to a second side of the second spacer layer, the first side and the second side being opposite to each other.

13. The magnetoresistive device as claimed in claim 12, wherein each of the first spin enhancing layer and the second spin enhancing layer has a thickness of between about 0.1 nm and about 3.5 nm.

14. The magnetoresistive device as claimed in claim 12, wherein each of the first spin enhancing layer and the second spin enhancing layer comprises a single layer of cobalt-iron-boron or cobalt-iron or iron, or a bilayer structure comprising a first layer comprising cobalt-iron-boron, and a second layer comprising cobalt-iron.

15. The magnetoresistive device as claimed in claim 1, wherein the magnetic junction further comprises:
    a third fixed magnetic layer structure having a fixed magnetization orientation; and
    a second free magnetic layer structure having a variable magnetization orientation;
    wherein the first fixed magnetic layer structure, the second fixed magnetic layer structure, the third fixed magnetic layer structure, the free magnetic layer structure and the second free magnetic layer structure are arranged one over the other,
    wherein the third fixed magnetic layer structure and the second free magnetic layer structure have respective magnetization orientations configured to orient in a direction at least substantially perpendicular to the plane defined by the interface between the free magnetic layer structure and either one of the first fixed magnetic layer structure or the second fixed magnetic layer structure, and wherein the magnetization orientation of the third fixed magnetic layer structure is oriented anti-parallel to the magnetization orientation of either the first fixed magnetic layer structure or the second fixed magnetic layer structure.

16. The magnetoresistive device as claimed in claim 15, wherein the third fixed magnetic layer structure is a static fixed magnetic layer structure having a switching field that is larger than a switching field of the second free magnetic layer structure.

17. The magnetoresistive device as claimed in claim 15, wherein the third fixed magnetic layer structure comprises a single layer comprising iron-platinum or cobalt-platinum or a bilayer structure comprising a first layer comprising cobalt or iron or cobalt-iron, and a second layer comprising platinum or palladium or nickel.

18. The magnetoresistive device as claimed in claim 15, wherein the second free magnetic layer structure is arranged between the third fixed magnetic layer structure and either the first fixed magnetic layer structure or the second fixed magnetic layer structure.

19. The magnetoresistive device as claimed in claim 15, wherein the magnetic junction further comprises a third spacer layer arranged between the third fixed magnetic layer structure and the second free magnetic layer structure, the third spacer layer having a spin diffusion length configured to reduce interaction of a spin current from the third fixed magnetic layer structure on the magnetization orientation of the second free magnetic layer structure.

20. The magnetoresistive device as claimed in claim 19, wherein the third spacer layer comprises a conductive and non-magnetic material.

* * * * *